(12) United States Patent
Taussig

(10) Patent No.: US 6,549,099 B2
(45) Date of Patent: Apr. 15, 2003

(54) ELECTRICALLY-COUPLED MECHANICAL BAND-PASS FILTER

(75) Inventor: Carl P. Taussig, Redwood City, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/896,472

(22) Filed: Jun. 29, 2001

(65) Prior Publication Data

US 2003/0006861 A1 Jan. 9, 2003

(51) Int. Cl.⁷ .............. H03H 9/46; H03H 9/50; H03H 9/52
(52) U.S. Cl. ...................... 333/186; 333/218
(58) Field of Search .............. 333/186, 197, 333/200, 218

(56) References Cited

U.S. PATENT DOCUMENTS

| | | | | |
|---|---|---|---|---|
| 3,686,593 A | | 8/1972 | Zakaria | 333/200 |
| 3,803,521 A | | 4/1974 | Hetzel | 333/200 |
| 3,914,719 A | * | 10/1975 | Hetzel | 333/200 |
| 5,455,547 A | * | 10/1995 | Lin et al. | 333/186 |
| 5,640,133 A | * | 6/1997 | MacDonald et al. | 333/197 |
| 6,393,913 B1 | * | 5/2002 | Dyck et al. | 333/186 X |

* cited by examiner

*Primary Examiner*—Barbara Summons

(57) ABSTRACT

The present invention provides an electromechanical band-pass filter for use in PIRM memory arrays utilizing miniature micro-movers on a single substrate. The band-pass filter includes first and second masses, each mass being independently movable in a common direction relative to the substrate and to other mass. A first spring element has one end attached to the substrate and the other end attached to the first mass. A second spring element has one end attached to the first mass and the other end attached to the second mass. An input transducer is provided for receiving an input frequency and applying a force to the first mass in the direction of motion of the first mass, the force being representative of the input frequency. An output transducer is associated with the first and second masses for providing an output frequency representative of the relative motion between the first and second masses.

34 Claims, 3 Drawing Sheets

ELECTRICALLY-COUPLED MECHANICAL BAND-PASS FILTER

BACKGROUND OF THE INVENTION

1. Field of Invention

The present invention pertains to the field of band-pass filters. More particularly, this invention relates to electrically-coupled mechanical band-pass filters for use in multiplexed address systems in memory arrays.

2. Background

Portable consumer devices are becoming increasingly sophisticated and requiring structure to generate and/or utilize digital data in increasingly large quantities and small compact sizes. Digital devices, such as digital cameras, may require at least hundreds of megabytes (MB) of data storage built into or attachable to the camera. To provide for this type of data storage application, future storage memories should be relatively low in cost, extremely compact and have sufficient capacities of around 100 MB to one gigabyte (GB). The storage memory should also be low in power consumption, less than one watt, and have relatively rugged physical characteristics to cope with the portable battery powered operating environment.

For archival storage, data need only be written to the memory once. Preferably the memory should have a short access time, in the order of milliseconds, and a moderate transfer rate, such as 2 MB per second. Preferably, the storage memory should be able to be capable of interfacing with a wide variety of industry standard platforms and modules.

One application for meeting this demand involves the use of write-once cross point memory devices. In cross point memory arrays, a matrix of memory elements are formed, each comprising a fuse or anti-fuse and a diode connected in series. The memory elements are formed by a plurality of semiconductor and insulation layers disposed between orthogonal conductive lines or electrodes.

One application for utilizing write-once cross point memory arrays to provide high density archival storage in portable devices is described in co-pending U.S. patent application No. 09/875,356, filed Jun. 5, 2001, entitled "Write-Once Memory", the disclosure of which is incorporated herein by reference. The memory system disclosed therein, referred to as portable inexpensive rugged memory (PIRM), provides high capacity write-once memory at low cost for archival storage. This result is realized in part by avoiding silicon substrates, minimizing process complexity and lowering areal density. The memory system includes a memory module formed of a laminated stack of integrated circuit layers constructed on thin-film plastic substrates. Each layer contains a cross-point diode memory array, and sensing of the data stored in the array is carried out from a separate integrated circuit remotely from the memory module.

Because PIRM memory is relatively inexpensive, users will likely acquire a large number of PIRM modules with a variety of stored content. It is important to be able to fabricate and assemble memory modules in straightforward and relatively inexpensive processes that minimize the need for precision while maximizing information storage density and simplifying addressing, reading and writing functions.

The probable lowest cost method of implementation of the PIRM memory system is one in which the controller and other reusable electronics are either embedded in the consumer product or reside in an adapter that inserts into a memory card slot. The PIRM memory module would connect via a proprietary interface to the controller. A major problem in such a system is that the apparatus to make the connection between the controller and the memory module may involve a large number of connections, on the order of 120 or more, a formidable challenge for compact high-density memory devices. Accordingly address multiplexing is needed to reduce the number of external connections to the memory array, such as time division or frequency division multiplexing.

A system for substantially reducing the interconnects to a memory device using frequency division multiplexing is described in co-pending United States Patent Application Ser. No. 09/894,143, entitled "Method For Reducing the Number of Interconnections to PIRM Memory Module," the disclosure of which is incorporated herein by reference. In that system the addresses of memory elements are spread over a predetermined frequency spectrum in order to express the multiple memory addresses on a single input/output line. To use such a system the multiple addresses must be accessed by means for separating out the addresses according to their assigned frequencies.

Accordingly, what is needed is a band-pass filter system to enable accessing various addresses of a PIRM memory device in accordance to their unique frequencies. This band-pass filter must be highly sensitive to determine small variations in frequencies in order to maintain a large number of addresses in a relatively small frequency spectrum. Moreover, such a band-pass filter must be very small (micrometer range), easily constructed on a thin-film, roll-to-roll plastic substrate and able to interact with other miniature PIRM-type devices on the substrate.

In the PIRM environment, simple RC band-pass filters are not feasible because of unacceptably high power consumption. Such filters also have an attenuation rate of 20 db per decade, which is too low to provide for the necessary number of signals over a given frequency spectrum needed to address a PIRM memory array. Active filters using transistor elements would likely be too expensive. LCR filters could be designed for PIRM, but the fabrication of inexpensive compact inductors is daunting and does not appear to be practically feasible.

A solution to the above problem might be to utilize a mechanically actuated band-pass filter. An example of an electromechanical band-pass filter is shown in U.S. Pat. No. 3,803,521 (Hetzel), in which electro-magnetic transducers are used to convert electrical energy to mechanical energy or the reverse, so as to filter out the desired frequencies. Another application using electrostatic electromechanical resonators is shown in U.S. Pat. No. 3,686,593 (Zakaria), in which a vibrating reed is driven by electrostatic forces between itself and an output electrode and the output is represented by capacitance changes between the reed and an output electrode. Both the Hetzel and Zarkaria systems were designed in the 1970's and are clearly outdated by present technologies, such as PIRM. Moreover, the Zakarian circuitry utilizes a variation of the air gap between capacitors to generate the output signal. This approach results in a nonlinear relationship between the force and the displacement, making stable operation difficult.

SUMMARY OF THE INVENTION

The present invention provides an electromechanical band-pass filter for use in PIRM memory arrays. The system of the present invention utilizes electrically coupled micro-resonators as filters, implementing micro electro-mechanical systems (MEMS) technology in which large numbers of miniature micro-movers are fabricated on a single substrate. The system of the present invention provides a narrow band-pass filter having a sharp frequency roll-off, typically 40 db per decade, and very high impedance that can be implemented in a simple, low temperature, inexpensive process not involving integrated circuitry. The present invention meets the basic needs of PIRM technology by having very low power consumption, high attenuation outside of the pass-band and utilizing simple fabrication techniques compatible with plastic substrates.

In one embodiment of the preferred invention, an electrically-coupled, mechanical band-pass filter fabricated on a substrate includes first and second masses, each mass being independently movable preferably in at least one direction relative to the substrate and to the other mass. A first spring element has one end attached to the substrate and the other end attached to the first mass.

A second spring element has one end attached to the first mass and the other end attached to the second mass. An input transducer is provided for receiving an input frequency and applying an input force to the first mass, the input force having a force component in the direction of motion of the first mass, the input force being influenced by the input frequency. An output transducer is associated with the first and second masses for providing an output frequency influenced by the relative motion between the first and second masses.

Another embodiment of the present invention involves a method of band-pass filtering the frequencies of an oscillator on a substrate common with first and second masses, each mass being independently movable along in at least one direction, and first and second spring elements. One end of the first spring element is connected to the first mass and the other end of the first spring element is connected to the substrate. One end of the second spring element is connected to the first mass and the other end of the second spring element is connected to the second mass. An input force is applied to the first mass, the input force having a component in the direction of motion of the first mass. The input force is influenced by an input frequency provided by an input transducer. An output frequency is generated that is influenced by the relative motion between the first and second masses by means of an output transducer associated with the first and second masses.

Other aspects and advantages of the present invention will become apparent from the following detailed description, which in conjunction with the accompanying drawings illustrates by way of example the principles of the present invention.

DETAILED DESCRIPTION OF THE INVENTION

Figure 1:
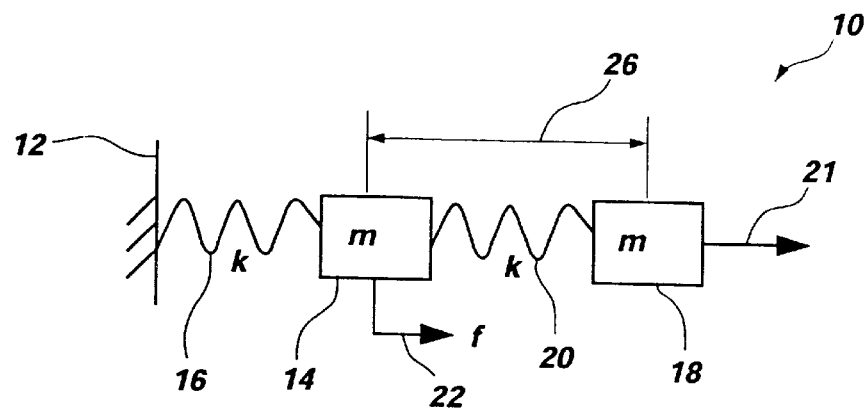
FIG. 1 is an abstract sketch illustrating the relationship of elements of an electromechanical band-pass filter in accordance with a preferred embodiment of the present invention.

Referring to FIG. 1, a sketch illustrates the relationship of elements of an electromechanical band-pass filter 10 for a preferred embodiment of the present invention.

The band-pass filtering is carried out by a second order mechanical system, comprising a first mass 14 connected to a substrate 12 by a first spring element 16 as shown. A second mass 18 is connected to the first mass 14 by a second spring element 20. Masses 14 and 18 are free to move in at least one common direction 21 relative to the substrate 12.

The input to the mechanical filter system 10 is a periodic force 22 applied to the first mass 14 in the common direction 21. Force 22 is preferably applied by a conventional electrostatic transducer (not shown) receiving a variable input frequency and converting it to a variable output force 22 corresponding to the input frequency.

The output from the mechanical filter system 10 is based on the change in the distance 26 between mass 14 and mass 18. This output is sensed by a conventional electrostatic transducer (not shown) that converts the change in distance x to an electrical output signal.

In operation, at very low frequencies, mass 14 moves slowly in the x direction. Mass 18 moves in concert with mass 14, so that the distance 26 between masses does not change and the output signal is zero. At the other end of the spectrum, at very high frequencies, the inertia of mass 14 overcomes the force 22 and mass 14, and thus mass 18 also, do not move. Accordingly, at high frequencies the output signal is also zero. At intermediate frequencies, there is a tendency of mass 18 to lag behind mass 14, leading to relative motion between the masses and thus a change in distance 26. Accordingly an output signal is generated. The boundaries within which a significant output signal is generated defines the pass band, and the degree to which the output signal drops off on either side of the pass band is controlled by various factors to be discussed herein and defines the shape of the pass band frequency window.

In one preferable embodiment, electrical signals are coupled to the band pass system electrostatically. There are many possible configurations of electrodes that will provide the necessary coupling. The input is coupled to the system by any arrangement of conductors and dielectrics that leads to a variation in capacitance, as the first mass is moved and is unchanged by other motions of the mechanical band-pass filter system. Similarly, the output signal is provided by an arrangement of dielectrics and conductors that has a change in capacitance only in response to the relative motion between the two masses.

Alternatively, other electronic coupling mechanisms besides electrostatic coupling could be implemented within the scope of the invention. For example, a piezo-electric transducer may be used at the input or the output or both, so that a signal is applied at the input and/or generated at the output that is proportional to the strain placed on a piezo-electric transducer. Another alternative embodiment may involve the use of an electret as a transducer, whereby charges are trapped on the material that affect the input or output signal when an electric field is applied to the electret.

Figure 2:
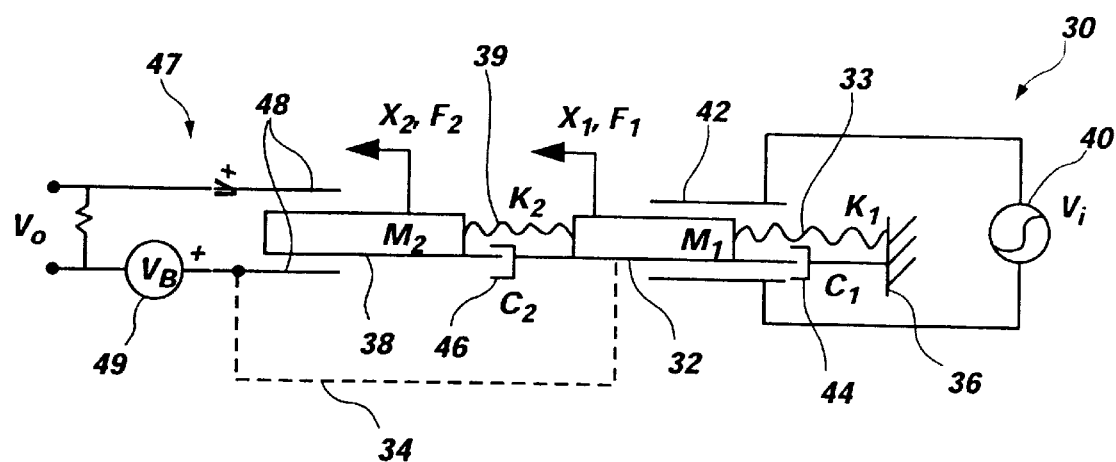
FIG. 2 is a simplified circuit diagram depicting a preferred embodiment of the present invention abstractly shown in FIG. 1.

FIG. 2 shows a schematic embodiment of the elements of a band-pass filter 30 in accordance with the present invention. As discussed mass 32 is coupled via a spring 33 to substrate 36 and has a range of motion at least in the x direction. Mass 38 is coupled to mass 32 by a spring 39 and also has a range of motion at least in the x direction. Masses 32 and 38 are made of a dielectric material having a specific permeability ($\epsilon$). The input signal $V_i$ is generated by an oscillator 40 that is coupled by electrical plates 42 to the inherent capacitance of mass 32, thereby impressing a force that may overcome the inertia of mass 32 and spring 33, resulting in motion of mass 32 in the x direction. The unit 44 ($C_1$) represents the damping of the system on mass 32.

The motion of mass 32 is conveyed via spring 39 to mass 38, resulting in motion in the x direction of mass 38. An output device 47 includes electrical plates 48 interacting with the capacitance of mass 38. Motion of mass 38 relative to output device 47 causes a change in the battery voltage $V_B$ generated by battery 49, thereby generating a periodic output voltage $V_o$ across plates 48. Mass 32 is rigidly connected via a mechanical link 34 to the output device 47, so that motion of mass 32 causes comparable motion of output device 47. The unit 46 ($C_2$) represents the damping of the system on mass 38.

Accordingly the only change in the output signal $V_B$ is generated when mass 38 moves relative to mass 32 and thus relative to output device 47.

The mechanical system equations of motion for the system shown in FIG. 2 are as follows:

$$M_1 \ddot{X}_1 = -K_1 X_1 - K_2(X_1 - X_2) - C_1 \dot{X}_1 - C_2(\dot{X}_1 - \dot{X}_2) + F_1 \quad (1)$$

$$M_2 \ddot{X}_2 = -K_2 X_2 - C_2(\dot{X}_2 - \dot{X}_1) + F_2 + K_2 X_1 \quad (2)$$

Then force $F_1$ acting on mass 32 ($M_1$) can be derived from simple electrostatic theory, as follows:

$$F_1 \frac{dU_1}{dx} = \frac{d}{dx}\left(\frac{1}{2} C V_i^2\right)$$

$$F_1 = \frac{V_i^2}{2}(\varepsilon - \varepsilon_0 / d) w \quad (3)$$

Where $\epsilon$ is the permeability of the material in the gap, $\epsilon_0$ is the permeability of free space, w is the width into the paper and d is the gap between the plates 42 or 48. The calculation of $F_2$ and $V_o$ are coupled through the capacitance of plates 48

For the conservative system:

$$dU = Vdq - fd\xi \quad (4)$$

$\xi = X_2 - X_1$ (the relative displacement of the masses) Assuming small changes in V and expressing the equation as a function of time:

$V^2/2 dc/d\xi d\xi/dt = Vdq/qt - fd\xi/dt$ $V^2/2 dc/d\xi_2 d\xi_2/dt = V dq/qt - fd\xi_2/dt$ $dc/d\xi^2 = (\epsilon - \epsilon_0) w_2 / d_2$ $dq/dt = -i$ $F_2 \cong V^2/2(\epsilon - \epsilon_0) w_2 / d_2$ $V_i = V^2(\epsilon - \epsilon_0) w_2 / d_2 d\xi/dt$ $i = V(\epsilon - \epsilon_0) w_2 / d_2 d\xi/dt$ Since $V = V_o - V_B$ and $V_o = iR$, then $$V_o = -V_B(R(\epsilon - \epsilon_0) w_2 / d_2 d\xi/dt)/(1 - R(\epsilon - \epsilon_0) w_2 / d_2 d\xi/dt) \quad (5)$$

$$F_2 \cong V_B^2(\epsilon - \epsilon_0) w_2 / 2d_2 (1 - R(\epsilon - \epsilon_0) w_2 / d_2 d\xi/dt) \quad (6)$$

The electromechanical system of equations (1), (2), (3), and (6) can be integrated to give the motion of the system as a function of time with respect to an applied input voltage $V_i$ and a steady battery voltage $V_B$. The output voltage $V_o$ can then be calculated from equation 5 substituting $\epsilon = X_2 - X_1$ (equation 4)

As shown in equation (3) the force $F_1$ applied to mass 32 corresponds to the square of the voltage $V_i$ applied to the input capacitor 44. Thus, the mass 38 is driven at twice the frequency of the oscillating input frequency. The voltage output $V_o$, as shown above, is proportional to the relative velocity between the masses 32 and 38, so the output $V_o$ also responds at twice the input frequency. This provides a multiplying factor to the pass-band filter that affects the pass-band profile, as will be discussed below.

The pass-band of the filter is determined by the mechanical resonances of the system. For a system in which the masses 32 and 38 are equal, the stiffness of spring elements 33 and 39 are the same, and the effects of damping are small, the pass-band is determined by the equation):

$$F_o = \frac{3 \pm \sqrt{5}}{2} \sqrt{\frac{k}{m}}, \quad (7)$$

where $F_o$ is the output frequency in cycles per second, k is the spring element stiffness for each of the first and second spring elements in units of newtons per meter, and m is the mass of each of the first and second masses in units of kilograms.

It is understood that the masses and spring stiffness may be altered, the two masses may be given different weights, and the two springs may have different stiffness characteristics, depending on the specifications of the filter. Moreover, the pass-band filter may be made electrically programmable by adding other electrostatic elements that change the stiffness or the masses of the components in response to an applied voltage. In the event that the masses and spring stiffness are not the same, a more general equation can be derived by one of ordinary skill in the art to determine the output frequency.

One alternative is to have a tensile force applied to a beam spring so that the stiffness increases with the cube of the tensile load. Another variation is to provide a cantilever spring having an effective length that is changed by the application of an electrostatic clamp. In this case, the stiffness is proportional to the cube of the effective length. The flatness of the pass-band is determined by the spacing of the natural frequencies of the system and the damping of the mechanical system. Typically, the Q of an electrostatic resonator for in-plane oscillations can be on the order of 30.

In the system shown in FIG. 2, the masses 32 and 38 were assumed to be made of dielectric material. In that case, equation (3) indicates that the force generated is a function of the permeability of the masses ($\epsilon$), the permeability of air ($\epsilon_0$), the width of the capacitor plates (w) and the distance between the plates (d). In other words, ignoring the factor ($V_i^2/2$):

$$F_x = \frac{(\varepsilon - \varepsilon_o)w}{d} \quad (8)$$

As an alternative, if the masses are conductors, the critical air gap becomes the space between the plates 42 or 48 (d) and only the permeability of air is considered. Thus the equation for the generated force becomes:

$$F_x = \frac{\varepsilon_o w}{d} \quad (9)$$

Figure 3:
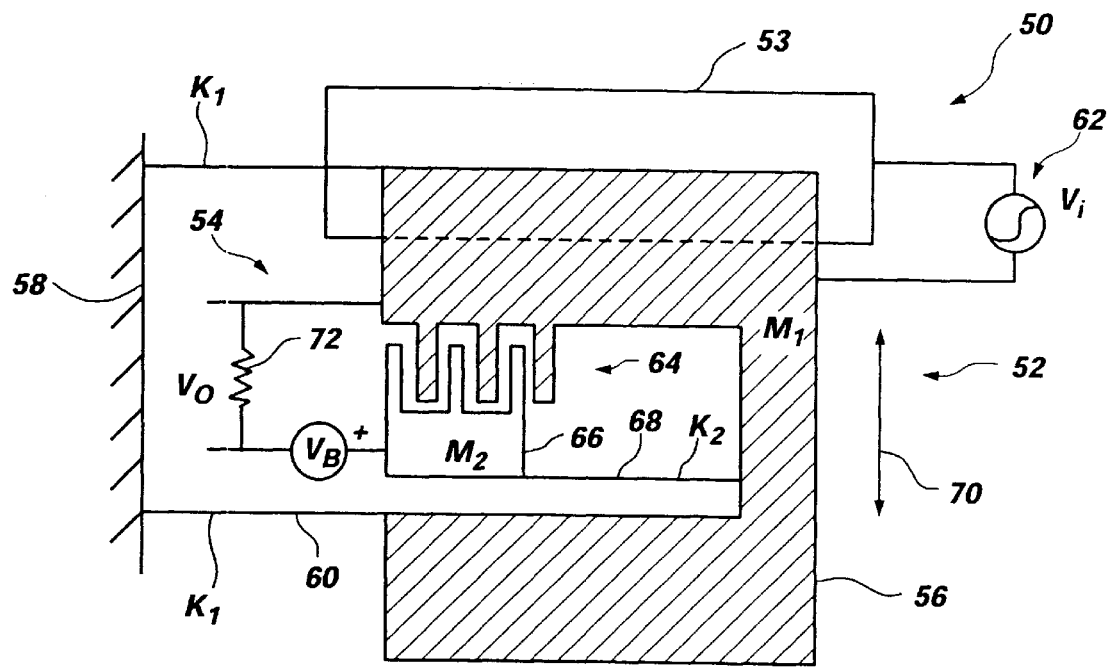
FIG. 3 is simplified schematic view of another preferred embodiment of the present invention abstractly shown in FIG. 1.

Looking now at FIG. 3, another preferred implementation system 50 of the pass-band filter of the present invention is shown. System 50 has an input stage 52 and an output stage 54. In the input stage, mass 56 ($M_1$) is anchored to substrate 58 by spring element 60 ($K_1$). A surface drive oscillator 62 provides the input frequency for the input stage 52 via capacitance plates 53 on either side of mass 56, only one of which is shown. Output stage 54 comprises a comb drive 64 made of interleaving teeth from mass 56 and mass 66 ($M_2$). Mass 66 is connected to mass 56 by spring element 68 ($K_2$). Preferably spring elements 60 and 68 are leaf spring flexures that are fabricated together with masses 56 and 66 in a single fabrication process.

In this system, masses 56 and 66 are assumed to be conductors, so that equation (9) applies, where the critical gap (d) for the input force is the space between the input electrodes. The critical gap (d) for purposes of using equation (9) to calculate the output force is the air gap between the teeth or interdigitated fingers of the comb drive 64 times the number of interdigitated fingers and w is the width of the interdigitated fingers into the page.

Output voltage $V_o$ is taken across a resistor 72 connected between masses 56 and 66 in series with a battery voltage $V_B$. The comb drive 64 acts as a variable capacitor between the masses 56 and 66, changing capacitance as the masses move relative to each other in the direction 70. This variance in capacitance of comb drive 64 varies the output voltage $V_o$ across resistor 72. Thus, an output voltage is generated having a frequency in the desired frequency band.

As stated above, the frequency of the output voltage $V_o$ is proportional to twice the input frequency. Accordingly, the input frequency is selected so that twice the input frequency is the desired output frequency.

Figure 4:
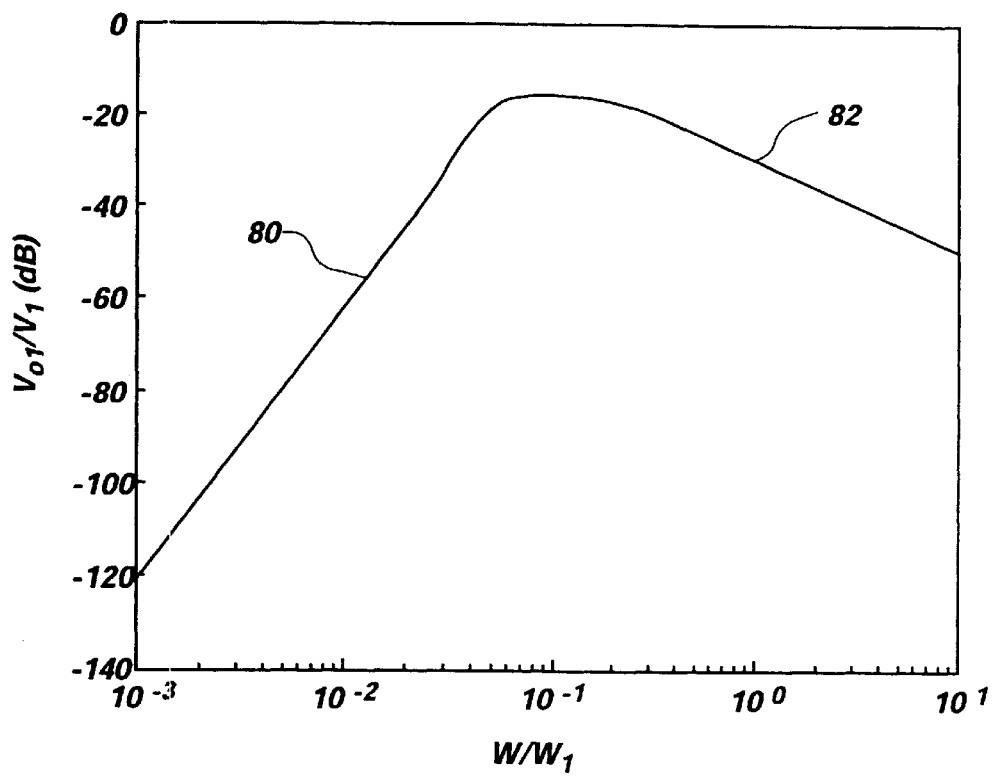
FIG. 4 is a graphic representation of the band-pass filter response in accordance with a preferred embodiment of the present invention.

Referring now to FIG. 4, the attenuation outside of the pass-band asymptotically approaches 40 db per decade for the relative position of the two masses. The electrical output of the system is proportional to the relative velocity of the two masses. Therefore, the transfer function from an input voltage to an output voltage slopes into the pass-band at 60 db per decade at the input 80 and exits the pass-band 82 at 20 db per decade, as shown in the graph. Similarly, the transfer function from the input current to an output current enters the pass-band at 20 db per decade and exits at 60 db per decade. Accordingly, the pass-band profile is not symmetrical, as may be desired in some applications.

Figure 5:
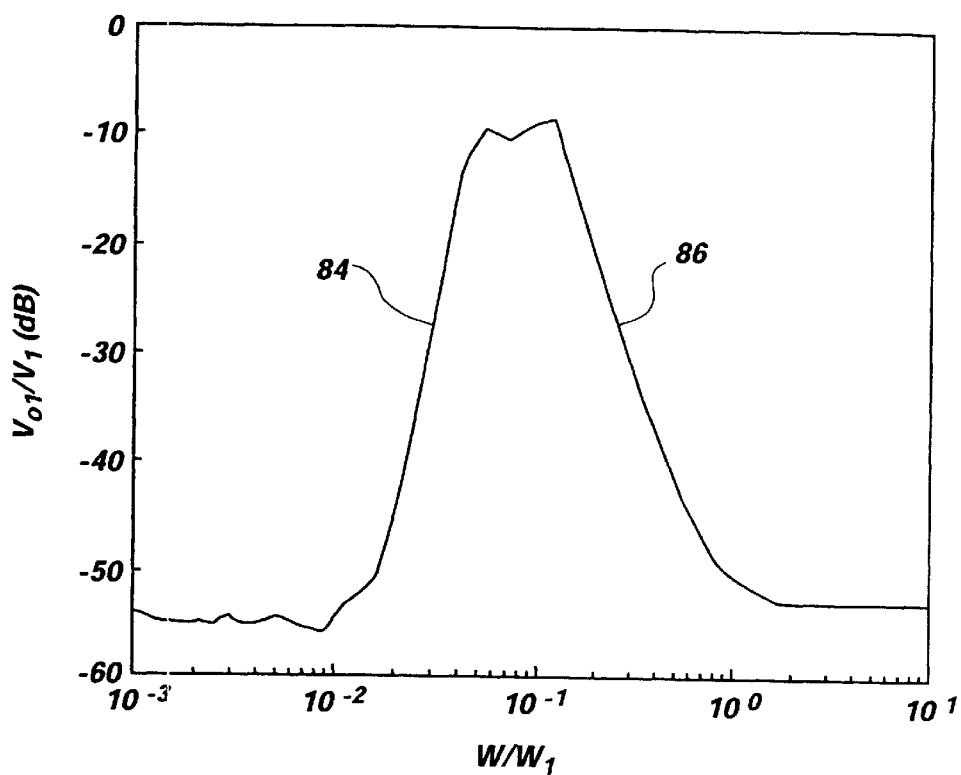
FIG. 5 is a graphic representation of the band-pass filter response in accordance with a preferred embodiment of the present invention.

There are several solutions for improving the symmetry of the transfer function. One solution is to add a passive RC low-pass or high-pass filter with a cutoff centered in the pass-band at the front of the filter. Since the input voltage is squared as it becomes the input for to the mechanical resonator, this solution can be used to provide a filter with symmetrical 60 db per decade roll-off on both input 84 and exit 86 sides of the pass-band, as shown in FIG. 5. Although this pass-band profile would be ideal, the additional RC filter adds intolerable power dissipation to the system.

In the present application, the filters are used to extract signals from a common line where they have been consolidated. Since the signals are known controllable inputs, their amplitude can be scaled to shape the output signal as desired. If the input amplitudes are scaled with the square root of their frequencies, and assuming that there are no other noise sources on the line, the signals will be discriminated symmetrically, so that the filter has a symmetric 40 db per decade roll up at the input 90 and roll off at the output 92 out of the pass-band. Any white noise will be filtered asymmetrically in this case. However, the power consumption will be much smaller than in the case with the additional passive filter.

The following is an explanation of why prescaling the inputs by the square root of the input frequency ($\sqrt{\omega}$) makes the effective bandpass frequency response symmetrical. The unmodified transfer function of the filter slopes into the passband at +60 dB/dec and exits the passband at a slope of −20 dB/dec. If this transfer function is multiplied by $1/\omega$ it will decrease the amplitude by 20 dB/dec across the entire frequency spectrum, thereby making the bandpass filter response slope into the passband at +40 dB/dec and exit the passband with a slope of −40 dB/dec. This is the desired symmetric frequency response to make the pass-band profile symmetrical. Since the inputs signals are known and controllable their amplitudes can be prescaled by a factor proportional to $1/\sqrt{\omega}$ in order to achieve this effect. As described in the preceding paragraphs, the amplitude of the output voltage depends on the square of the input voltage amplitude, that is:

$$V_o \, V_i^2 F(\omega)$$

where $V_o$ is the output amplitude, $V_i$ is the input amplitude and $F(\omega)$ is the frequency dependent portion of the transfer function. Prescaling the inputs by $1/\sqrt{\omega}$ has the desired effect of dividing the transfer function by a factor of $\omega$:

$$V_o \propto \left(\frac{V_i}{\sqrt{\omega}}\right)^2 F(\omega) \quad V_i \frac{F(\omega)}{\omega}$$

Figure 6:
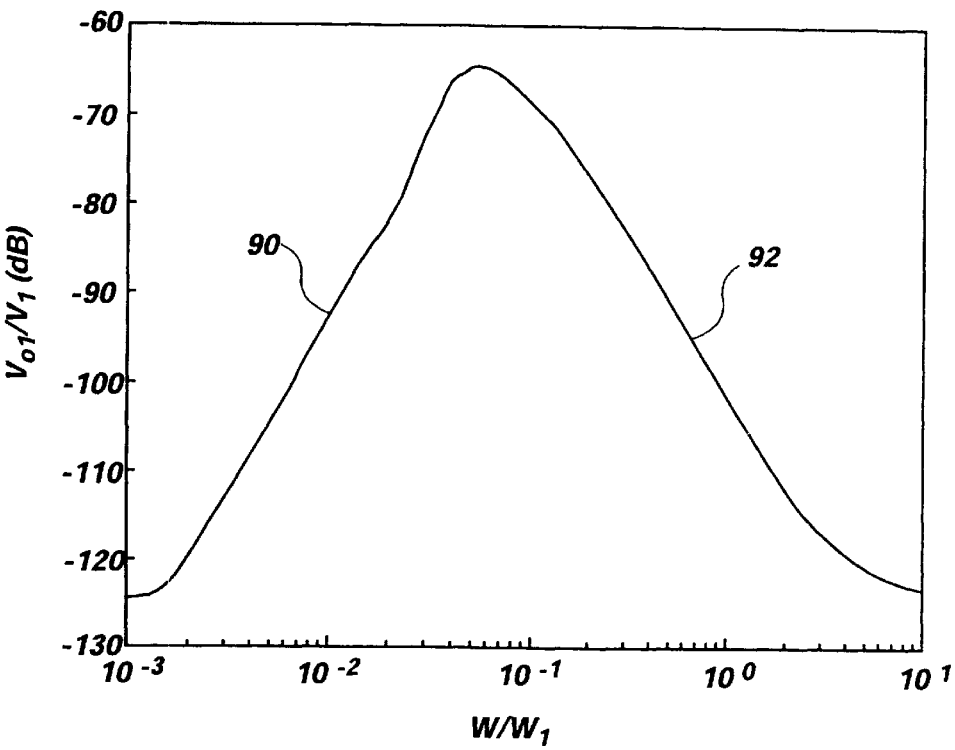
FIG. 6 is a graphic representation of the band-pass filter response in accordance with a preferred embodiment of the present invention.

FIG. 6 illustrates a simulated frequency response for the system described above. Assuming that no passive components have been added to form an input pre-filter, the input impedance will be dominated by the capacitance of the comb or surface drive structure used to actuate the mechanical system. These structures will probably have capacitances of a picofarad or less.

Another useful characteristic of the pass-band filter of the present invention is that it can provide complete electrical isolation between the input and the output circuits. The electrical circuits of the input and output are completely separate. The actual implementation of the filter may involve coupling the input and output electrically if a common conductive substrate is used to form a portion of both the input and the output capacitors, as shown in FIG. 3. However, this is a design choice and is not a limitation of the concept of this invention.

Although the above embodiments are representative of the present invention, other embodiments will be apparent to those skilled in the art from a consideration of this specification and the appended claims, or from a practice of the embodiments of the disclosed invention. It is intended that the specification and embodiments therein be considered as exemplary only, with the present invention being defined by the claims and their equivalents.

What is claimed is:

1. An electrically-coupled, mechanical band-pass filter fabricated on a substrate, comprising:

first and second masses, each mass being independently movable in a direction of motion relative to the substrate and to the other mass;

a first spring element having one end attached to the substrate and the other end attached to the first mass;

a second spring element having one end attached to the first mass and the other end attached to the second mass, the second mass being connected only to the first mass;

an input transducer for receiving an input frequency and applying an input force to the first mass, the input force having a force component in the direction of motion of the first mass, the input force being influenced by the input frequency; and an output transducer associated with the first and second masses for providing an output frequency influenced by the relative motion between the first and second masses.

2. The band-pass filter of claim 1, wherein the first and second masses comprise a drive unit that determines the output frequency by the movement between the first and second masses.

3. The band-pass filter of claim 2, wherein the drive unit includes a capacitor associated with the movement between the first and second masses to determine the output frequency by variations in the capacitance of the capacitor.

4. The band-pass filter of claim 1, wherein the first and second masses comprise a comb drive with interleaved teeth, and wherein the movement between the first and second masses is determined by variations in capacitance in the comb drive.

5. The band-pass filter of claim 1, wherein the input transducer comprises an oscillator for generating the input frequency, the oscillator being capacitively coupled to the first mass to move the first mass relative to the input frequency.

6. The band-pass filter of claim 5, wherein the output transducer comprises an electrical output element mechanically linked to the first mass and capacitively coupled to the second mass to generate the output frequency.

7. The band-pass filter of claim 6, wherein the substrate provides a common capacitance for capacitively coupling with the first and second masses.

8. The band-pass filter of claim 6, wherein the input transducer is electrically isolated from the output transducer.

9. The band-pass filter of claim 1, wherein the output frequency is twice the input frequency.

10. The band-pass filter of claim 1, wherein the amplitude of the input frequency is scaled with the square root of the input frequency.

11. The band-pass filter of claim 1, wherein the output frequency is a mathematical function of the mass of each of the first and second masses and the stiffness of the first and second spring elements.

12. The band-pass filter of claim 11, wherein the mass of the first mass is equal to the mass of the second mass.

13. The band-pass filter of claim 12 wherein the mathematical function is expressed by the equation:

$$F_o = \frac{3 \pm \sqrt{5}}{2}\sqrt{\frac{k}{m}},$$

where $F_o$ is the output frequency in cycles per second, k is the spring element stiffness for each of the first and second spring elements in units of newtons per meter, and m is the mass of each of the first and second masses in units of kilograms.

14. The band-pass filter of claim 1 wherein the first and second masses move in a common direction and the input force is applied in the common direction.

15. The method of filtering the frequency of an input oscillator on a substrate common with first and second masses, each mass being independently movable in at least one direction, and first and second spring elements, comprising:

connecting one end of the first spring element to the first mass and the other end of the first spring element to the substrate;

connecting one end of the second spring element to the first mass and the other end of the second spring element to the second mass, the second mass being connected only to the first mass;

applying an input force to the first mass influenced by an input frequency provided by an input transducer, the input force leaving a component in the direction of motion of the first mass; and generating an output frequency influenced by the relative motion between the first and second masses by means of an output transducer associated with the first and second masses.

16. The method of claim 15, wherein a variable capacitor is associated with the movement between the first and second masses to determine the output frequency by variations in the capacitance of the capacitor.

17. The method of claim 16, wherein the first and second masses are disposed relative to each other to provide the variable capacitor.

18. The method of claim 15, wherein the input frequency is generated by the input oscillator, and further comprising capacitively coupling to oscillator to the first mass to move the first mass relative to the input frequency.

19. The method of claim 15, and further comprising mechanically linking the output transducer to the first mass and capacitively coupling the output transducer to the second mass to generate the output frequency.

20. The method of claim 15, and further comprising electrically isolating the input transducer from the output transducer.

21. The method of claim 15 and further comprising scaling the amplitude of the input frequency with the square root of the input frequency.

22. The method of claim 15 wherein the first and second masses move in a common direction and the input force is applied in the common direction.

23. An electrically-coupled, mechanical band-pass filter fabricated on a substrate, comprising:

first and second masses, each mass being independently movable in a direction of motion relative to the substrate and to the other mass;

a first spring element having one end attached to the substrate and the other end attached to the first mass;

a second spring element having one end attached to the first mass and the other end attached to the second mass;

the first and second masses comprising a drive unit that determines the output frequency by the movement between the first and second masses;

wherein the drive unit includes a capacitor associated with the movement between the first and second masses to determine the output frequency by variations in the capacitance of the capacitor;

an input transducer for receiving an input frequency and applying an input force to the first mass, the input force having a force component in the direction of motion of the first mass, the input force being influenced by the input frequency; and and output transducer associated with the first and second masses for providing an output frequency influenced by the relative motion between the first and second masses.

24. An electrically-coupled, mechanical band-pass filter fabricated on a substrate, comprising:

first and second masses, each mass being independently movable in a direction of motion relative to the substrate and to the other mass;

a first spring element having one end attached to the substrate and the other end attached to the first mass;

a second spring element having one end attached to the first mass and the other end attached to the second mass;

the first and second masses comprising a comb drive with interleaved teeth, and wherein the movement between the first and second masses is determined by variations in capacitance in the comb drive;

an input transducer for receiving and input frequency and applying an input force to the first mass, the input force having a force component in the direction of motion of the first mass, the input force being influenced by the input frequency; and an output transducer associated with the first and second masses for providing an output frequency influenced by the relative motion between the first and second masses.

25. An electrically-coupled, mechanical band-pass filter fabricated on a substrate, comprising:

first and second masses, each mass being independently movable in a direction of motion relative to the substrate and to the other mass;

a first spring element having one end attached to the substrate and the other end attached to the first mass;

a second spring element having one end attached to the first mass and the other end attached to the second mass;

an input transducer for receiving an input frequency and applying an input force to the first mass, the input force having a force component in the direction of motion of the first mass, the input force being influenced by the input frequency; and an output transducer associated with the first and second masses for providing an output frequency influenced by the relative motion between the first and second masses;

wherein the input transducer comprises and oscillator for generating the input frequency, the oscillator being capacitively coupled to the first mass to move the first mass relative to the input frequency, and the output transducer comprises an electrical output element mechanically linked to the first mass and capacitively coupled to the second mass to generate the output frequency.

26. The band-pass filter of claim 25, wherein the substrate provides a common capacitance for capacitively coupling with the first and second masses.

27. The band-pass filter of claim 25, wherein the input transducer is electrically isolated from the output transducer.

28. An electrically-coupled, mechanical band-pass filter fabricated on a substrate, comprising:

first and second masses, each mass being independently movable in a direction of motion relative to the substrate and to the other mass;

a first spring element having one end attached to the substrate and the other end attached to the first mass;

a second spring element having one end attached to the first mass and the other end attached to the second mass;

an output transducer for receiving an input frequency and applying an input force to the first mass, the input force having a force component in the direction of motion of the first mass, the input force being influenced by the input frequency; and in output transducer associated with the first and second masses for providing an output frequency influenced by the relative motion between the first and second masses;

wherein the output frequency is twice the input frequency.

29. An electrically-coupled, mechanical band-pass filter fabricated on a substrate, comprising:

first and second masses, each mass being independently movable in a direction of motion relative to the substrate and to the other mass;

a first spring element having one end attached to the substrate and the other end attached to the first mass;

a second spring element having one end attached to the first mass and the other end attached to the second mass;

an input transducer for receiving an input frequency and applying an input force to the first mass, the input force having a force component in the direction of motion of the first mass, the input force being influenced by the input frequency; and an output transducer associated with the first and second masses for providing an output frequency influenced by the relative motion between the first and second masses;

wherein the amplitude of the input frequency is scaled with the square root of the input frequency.

30. An electrically-coupled, mechanical band-pass filter fabricated on a substrate, comprising:

first and second masses, each mass being independently movable in a direction of motion relative to the substrate and to the other mass;

a first spring element having one end attached to the substrate and the other end attached to the first mass;

a second spring element having one end attached to the first mass and the other end attached to the second mass;

an input transducer for receiving an input frequency and applying an input force to the first mass, the input force having a force component in the direction of motion of the first mass, the input force being influenced by the input frequency; and an output transducer associated with the first and second masses for providing an output frequency influenced by the relative motion between the first and second masses;

wherein the output frequency is a mathematical function of the mass of each of the first and second masses and the stiffness of the first and second spring elements;

wherein the mass of the first mass is equal to the mass of the second mass.

31. The band-pass filter of claim 30 wherein the mathematical function is expressed by the equation:

$$Fo = \frac{3 \pm \sqrt{5}}{2}\sqrt{\frac{k}{m}},$$

wherein Fo is the output frequency in cycles per second, k is the spring element stiffness for each of the first and second spring elements in units of newtons per meter, and m is the mass of each of the first and second masses in units of kilograms.

32. The method of filtering the frequency of an input oscillator on a substrate common with first and second masses, each mass being independently movable in at least one direction, and first and second spring elements, comprising:

connecting one end of the first spring element to the first mass and the other end of the first spring element to the substrate;

connecting one end of the second spring element to the first mass and the other end of the second spring element to the second mass;

applying an input force to the first mass influenced by an input frequency provided by an input transducer, the input force having a component in the direction of motion of the first mass; and generating an output frequency influenced by the relative motion between the first and second masses by means of an output transducer associated with the first and second masses;

wherein a variable capacitor is associated with the movement between the first and second masses to determine the output frequency by variations in the capacitance of the capacitor, the first and second masses being disposed relative to each other to provide the variable capacitor.

33. The method of filtering the frequency of an oscillator on a substrate common with first and second masses, each mass being independently movable in at least one direction, and first and second spring elements, comprising:

connecting one end of the first spring element to the first mass and the other end of the first spring element to the substrate;

connecting one end of the second spring element to the first mass and the other end of the second spring element to the second mass;

applying an input force to the first mass influenced by an input frequency provided by an input transducer, the input force having a component in the direction of motion of the first mass;

generating an output frequency influenced by the relative motion between the first and second masses by means of an output transducer associated with the first and second masses; and mechanically linking the output transducer to the first mass and capacitively coupling the output transducer to the second mass to generate the output frequency.

34. The method of filtering the frequency of an oscillator on a substrate common with first and second masses, each mass being independently movable in at least one direction, and first and second spring elements, comprising:

connecting one end of the first spring element to the first mass and the other end of the first spring element to the substrate;

connecting one end of the second spring element to the first mass and the other end of the second spring element to the second mass;

applying an input force to the first mass influenced by an input frequency provided by an input transducer, the input force having a component in the direction of motion of the first mass;

generating an output frequency influenced by the relative motion between the first and second masses by means of an output transducer associated with the first and second masses; and scaling the amplitude of the input frequency with the square root of the input frequency.

* * * * *